(12) United States Patent
Lee et al.

(10) Patent No.: US 8,552,631 B2
(45) Date of Patent: Oct. 8, 2013

(54) DISPLAY DEVICES WITH TRANSPARENT ELECTRODES CONTAINING NANOCARBON MATERIALS

(75) Inventors: Woo-Jae Lee, Yongin-si (KR); Hyeong-Suk Yoo, Yongin-si (KR); Sang-Joo Lee, Seoul (KR); Seung-Gi Joo, Seongnam-si (KR)

(73) Assignees: Samsung Display Co., Ltd. (KR); Seoul National University Industry Foundation (KR)

( * ) Notice: Subject to any disclaimer, the term of this patent is extended or adjusted under 35 U.S.C. 154(b) by 662 days.

(21) Appl. No.: 12/189,383

(22) Filed: Aug. 11, 2008

(65) Prior Publication Data

US 2009/0208733 A1 Aug. 20, 2009

(30) Foreign Application Priority Data

Feb. 15, 2008 (KR) ........................ 10-2008-0014138

(51) Int. Cl.
  *H01J 1/02* (2006.01)
  *B32B 7/00* (2006.01)
  *B32B 15/04* (2006.01)
  *H01J 9/02* (2006.01)

(52) U.S. Cl.
  USPC ............. 313/355; 313/352; 445/46; 428/408; 428/689; 428/699; 977/952

(58) Field of Classification Search
  USPC ......... 428/323, 328, 408, 329, 689, 697, 699; 977/882, 890, 902, 932, 952; 445/24, 445/46; 313/352, 355
  See application file for complete search history.

(56) References Cited

U.S. PATENT DOCUMENTS

| | | | | |
|---|---|---|---|---|
| 5,668,576 A | * | 9/1997 | Ikura et al. ..................... | 345/173 |
| 6,921,684 B2 | | 7/2005 | Dubin | |
| 8,309,226 B2 | * | 11/2012 | Brahim et al. ................ | 428/408 |
| 2006/0111008 A1 | * | 5/2006 | Arthur et al. .................... | 445/46 |
| 2006/0274048 A1 | * | 12/2006 | Spath et al. .................... | 345/173 |
| 2008/0083454 A1 | * | 4/2008 | Park et al. ..................... | 136/258 |
| 2008/0088219 A1 | * | 4/2008 | Yoon et al. .................... | 313/326 |

FOREIGN PATENT DOCUMENTS

| | | | |
|---|---|---|---|
| JP | 2003-288993 A | * | 10/2003 |
| JP | 2005-74472 | | 3/2005 |
| KR | 2002-0049630 | | 6/2002 |
| KR | 2003-0071921 | | 9/2003 |
| KR | 10-0426495 | | 4/2004 |
| KR | 10-2005-0011867 | | 1/2005 |
| KR | 10-2006-0014979 | | 2/2006 |
| KR | 10-054905/1 | | 2/2006 |
| KR | 10-0554155 | | 2/2006 |
| KR | 10-2007-0002111 | | 1/2007 |
| KR | 10-2007-0044412 | | 4/2007 |
| KR | 10-0709112 | | 4/2007 |
| KR | 10-2007-0049116 | | 5/2007 |
| KR | 10-2007-0049179 | | 5/2007 |
| KR | 10-2007-0059914 | | 6/2007 |
| WO | WO 2007004758 A1 | * | 1/2007 |
| WO | WO 2008001998 A1 | * | 1/2008 |

OTHER PUBLICATIONS

Machine translation of JP 2003-288993 A, provided by the JPO website (no date).*
English Language Abstract from Patent Abstracts of Japan for JP Publication No. 2005-074472, Mar. 24, 2005, 1 page.
English Language Abstract from Korean Intellectual Property Office for KR Publication No. 1020030056570, Jul. 4, 2003, 1 page.
English Language Abstract from Korean Intellectual Property Office for KR Publication No. 1020050006632, Jan. 17, 2005, 1 page.
English Language Abstract from Korean Intellectual Property Office for KR Publication No. 1020020049630, Jun. 26, 2002, 1 page.
English Language Abstract from Korean Intellectual Property Office for KR Publication No. 1020040107763, Dec. 23, 2004, 1 page.
English Language Abstract from Korean Intellectual Property Office for KR Publication No. 1020040107700, Dec. 23, 2004, 1 page.
English Language Abstract from Korean Intellectual Property Office for KR Publication No. 1020070002111, Jan. 5, 2007, 1 page.
English Language Abstract from Korean Intellectual Property Office for KR Publication No. 1020050011867, Jan. 31, 2005, 1 page.
English Language Abstract from Korean Intellectual Property Office for KR Publication No. 1020060014979, Feb. 16, 2006, 1 page.
English Language Abstract from Korean Intellectual Property Office for KR Publication No. 1020070044412, Apr. 27, 2007, 1 page.
English Language Abstract from Korean Intellectual Property Office for KR Publication No. 1020070049116, May 10, 2007, 1 page.
English Language Abstract from Korean Intellectual Property Office for KR Publication No. 1020070049179, May 10, 2007, 1 page.
English Language Abstract from Korean Intellectual Property Office for KR Publication No. 1020070059914, Jun. 12, 2007, 1 page.
English Language Abstract from Korean Intellectual Property Office for KR Publication No. 1020030071921, Sep. 13, 2003, 1 page.

* cited by examiner

*Primary Examiner* — Michael J Feely
(74) *Attorney, Agent, or Firm* — Innovation Counsel LLP

(57) ABSTRACT

A transparent electrode for a display device includes a nanocarbon material and a dopant comprising at least one of aluminum, alumina, palladium, and gold. In some embodiments, the transparent electrode has excellent transparency and low resistance.

15 Claims, 5 Drawing Sheets

_DISPLAY DEVICES WITH TRANSPARENT ELECTRODES CONTAINING NANOCARBON MATERIALS_

CROSS-REFERENCE TO RELATED APPLICATION

This application claims priority to and the benefit of South Korean Patent Application No. 10-2008-0014138 filed in the Korean Intellectual Property Office on Feb. 15, 2008, the entire contents of which are incorporated herein by reference.

BACKGROUND OF THE INVENTION (a) Field of the Invention

The present invention relates to a transparent electrode for a display device, a display device, and a method for manufacturing a display device.

(b) Description of the Related Art

Flat panel displays are often preferred to cathode-ray tube displays (CRTs). There are different types of flat panel displays including liquid crystal displays, organic electroluminescence displays, and electrophoretic displays. Also, much research has been undertaken to develop a flexible flat panel display that gives a paper-like feel to the user.

A flat panel display generally includes transparent electrodes. Transparent electrodes have been made from materials such as indium tin oxide (ITO) and indium zinc oxide (IZO). However, the electrodes made from these materials easily break if the display is bent. If an electrode is broken, its electrical conductivity is reduced. Therefore, these materials are not suitable for a flexible flat panel display.

In contrast, carbon materials such as carbon nanotubes and nanowire remain highly conductive even when the display device is bent. Therefore, the carbon materials are more suitable for transparent electrodes of flexible flat panel displays.

For use in transparent electrodes, the carbon material must have acceptable levels of transmittance and sheet resistance, which are inversely related to each other. It is desirable to provide displays with improved transparent electrodes.

SUMMARY

It is difficult to obtain a nanocarbon material with high transmittance and low sheet resistance because nanocarbon materials generally include many non-metallic (semiconducting) components.

Some embodiments of the present invention provide transparent electrodes made from nanocarbon materials which may or may not contain semiconducting components. For example, two thirds or more, possibly all, of the nanocarbon material may be semiconducting.

An exemplary embodiment of the present invention provides a display device comprising a transparent electrode formed on n insulation substrate. The transparent electrode comprises a nanocarbon material and a dopant comprising at least one of aluminum, alumina, palladium, and gold.

In some embodiments, the transparent electrode comprises: a nanocarbon layer comprising the nanocarbon material; and a dopant layer physically contacting the nanocarbon layer and comprising the dopant.

In some embodiments, a thickness of the dopant layer is about 3 to 7 nm.

In some embodiments, the nanocarbon material comprises at least one of carbon nanotubes and carbon nanowire.

In some embodiments, the insulation substrate is a plastic substrate.

Some embodiments provide a method for manufacturing a display device, the method comprising: obtaining an insulation substrate; and forming a transparent electrode on the insulation substrate, wherein the transparent electrode comprises: a nanocarbon material, and a dopant comprising at least one of aluminum, alumina, palladium, and gold.

In some embodiments, the transparent electrode consists essentially of the nanocarbon material and the dopant, and the dopant consists essentially of one or more of aluminum, alumina, palladium, and gold.

Some embodiments further comprise activating the transparent electrode.

In some embodiments, activating the transparent electrode comprises heating the transparent electrode using microwaves.

In some embodiments, forming the transparent electrode comprises: forming a dopant layer on the insulation substrate, the dopant layer comprising the dopant; and forming a nanocarbon layer on the dopant layer in physical contact with the dopant layer, the nanocarbon layer comprising the nanocarbon material.

In some embodiments, the dopant layer is formed by sputtering or evaporation.

In some embodiments, forming the nanocarbon layer comprises: obtaining a coating composition comprising the nanocarbon material; covering the dopant layer with the coating composition; and drying the coating composition covering the dopant layer.

In some embodiments, forming the transparent electrode comprises: forming a nanocarbon layer on the insulation substrate, the nanocarbon layer comprising the nanocarbon material; and doping the nanocarbon layer with the dopant.

In some embodiments, the doping is performed by sputtering or evaporation.

In some embodiments, forming the nanocarbon layer comprises: obtaining a coating composition comprising the nanocarbon material; covering the insulation substrate with the coating composition; and drying the coating composition covering the insulation substrate.

In some embodiments, forming the transparent electrode comprises preparing doped nanocarbon material by bringing the dopant into contact with the nanocarbon material in an acid solution.

In some embodiments, forming the transparent electrode comprises: obtaining a coating composition comprising the doped nanocarbon material; covering the insulation substrate with the coating composition; and drying the coating composition covering the insulation substrate.

This section summarizes some but not all features of the present disclosure of invention. Other features are described below. The present disclosure of invention is defined as including the appended claims which are incorporated into this section by reference.

DESCRIPTION OF SOME REFERENCE NUMERALS USED IN THE DRAWINGS

100: first substrate
140: first transparent electrode
200: second substrate
250: second transparent electrode

DETAILED DESCRIPTION OF SOME EMBODIMENTS

Some embodiments of the present invention will now be described with reference to the accompanying drawings.

It will be understood that when a layer is referred to as being "on" another layer, then intervening layers may or may not be present. In contrast, "directly on" excludes intervening layers.

Figure 1:
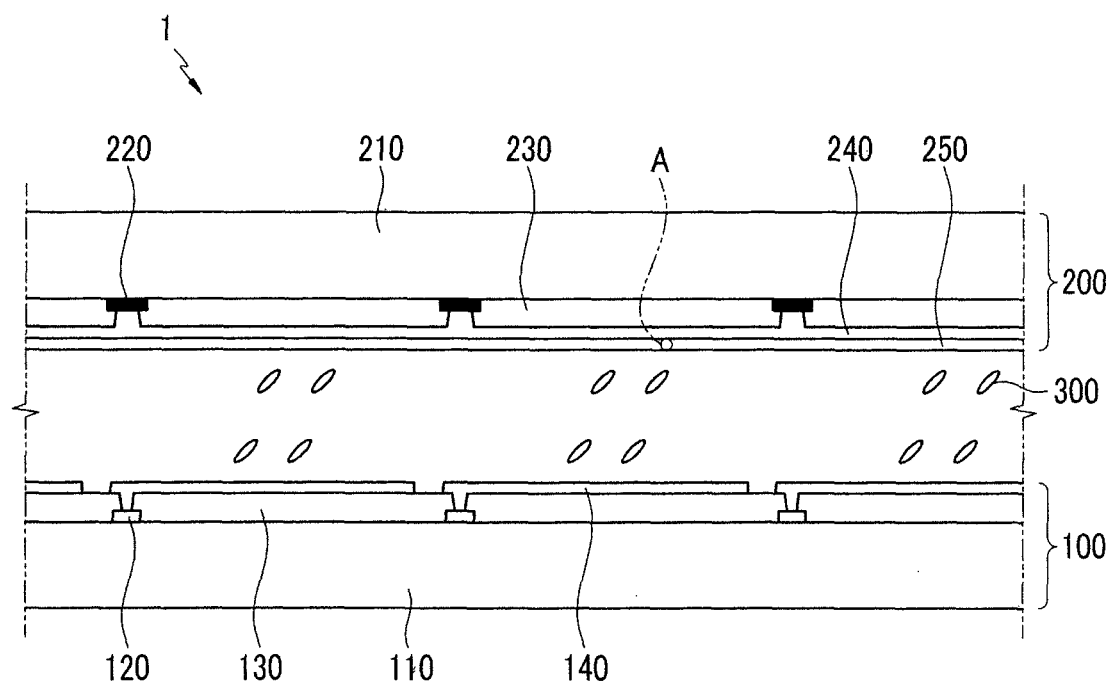
FIG. 1 is a cross-sectional view of a display device according to an exemplary embodiment of the present invention.

FIG. 1 illustrates a display device 1 according to an exemplary embodiment of the present invention. The display device 1 is a liquid crystal display. The display device 1 includes a first substrate 100, a second substrate 200, and a liquid crystal layer 300 disposed between the first substrate 100 and the second substrate 200.

The first substrate 100 includes a first insulation substrate 110, thin film transistors 120, an insulation layer 130, and first transparent electrodes 140. Each first transparent electrode 140 is electrically connected to a respective thin film transistor 120. The first transparent electrodes 140 are spaced from each other and electrically insulated from each other.

The second substrate 200 includes a second insulation substrate 210, a black matrix 220, color filters 230, an overcoat layer 240, and a second transparent electrode 250. The second transparent electrode 250 extends through the entire second substrate 200.

The liquid crystal layer 300 controls light transmittance by changing its alignment in response to an electrical field formed between the first transparent electrodes 140 and the second transparent electrode 250. The first transparent electrodes 140 are generally referred to as pixel electrodes. They may receive various voltages. The second transparent electrode 250 is referred as a common electrode, and is kept at a fixed voltage.

Since both the first insulation substrate 110 and the second insulation substrate 210 are made of plastic, the display device 1 is flexible. In some embodiments, only one of the first insulation substrate 110 and the second insulation substrate 210 is made of plastic. For example, only the second insulation substrate 210 may be made of plastic. Suitable plastic materials include materials made of any one or more of polycarbon, polyimide, polyethersulfone (PES), polyarylate (PAR), polyethylenenaphthalate (PEN), and polyethyleneterephthalate (PET).

The first transparent electrodes 140 and the second transparent electrode 250 are activated during manufacture as described in more detail below.

Figure 2:
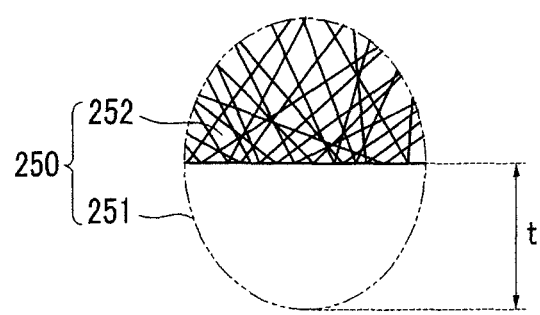
FIG. 2 is an enlarged view of a part A of FIG. 1.

The structure of the second transparent electrode 250 is shown in more detail in FIG. 2 which is an enlarged view of a part A of FIG. 1. The first transparent electrodes 140 have the same structure as the second transparent electrode 250.

The second transparent electrode 250 includes a dopant layer 251 and a nanocarbon layer 252. The dopant layer 251 is formed on the overcoat layer 240, and the nanocarbon layer 252 is formed on the dopant layer 251. Alternatively, the nanocarbon layer 252 may be formed on the overcoat layer 240 below the dopant layer 251. In either case, the dopant layer 251 physically contacts the nanocarbon layer 252.

The dopant layer 251 includes a dopant which consists of one or more of aluminum (Al), alumina ($Al_2O_3$), palladium (Pd), and gold (Au). In particular, the dopant layer 251 may also include any two or more of alumina ($Al_2O_3$), palladium (Pd), and gold (Au). The thickness (t) of the dopant layer 251 is about 3 nm to 7 nm. If the thickness of the dopant layer 251 is less than about 3 nm, the doping effect becomes insignificant. If the thickness of the dopant layer 251 is greater than about 7 nm, transparency of the electrode 250 suffers.

The nanocarbon layer 252 may include carbon nanotubes or carbon nanowire. As stated above, the nanocarbon layer 252 physically contacts the dopant layer 251.

The electrical properties of the nanocarbon layer 252 depend on the dopant layer 251 as follows. In general, carbon nanotubes can be either metallic or semiconducting. It is known that in a typical nanocarbon material, ⅓ of small-diameter carbon nanotubes are metallic. A low resistance transparent electrode can be formed by sorting out the metallic nanotubes and using only the metallic nanotubes for the transparent electrode. However, the sorting process can be difficult and costly.

On the other hand, the semiconducting carbon nanotubes have a band gap of only about 0.2 to 0.8 eV, which is lower than 1.1 eV for silicon. Therefore, the electrical conductivity of the semiconducting carbon nanotubes can be made quite good via doping. The doping method is also applicable to other nanocarbon materials, for example nanowire.

In the embodiment being described, the doping is accomplished using the dopant layer 251. In particular, aluminum acts as an N-type dopant for the semiconducting nanocarbon materials. This dopant improves the electrical conductivity. Alumina, palladium, and gold act as P-type dopants and also improve the electrical conductivity of the semiconducting nanocarbon materials. These dopants can therefore be used to reduce the sheet resistance of the transparent electrodes 140 and 250. As the sheet resistance is reduced, the nanocarbon layer 252 can be made thinner to improve transparency. Furthermore, the nanocarbon allows the transparent electrodes 140 and 250 to remain highly electrically conductive when the display device 1 is bent.

Figure 3:
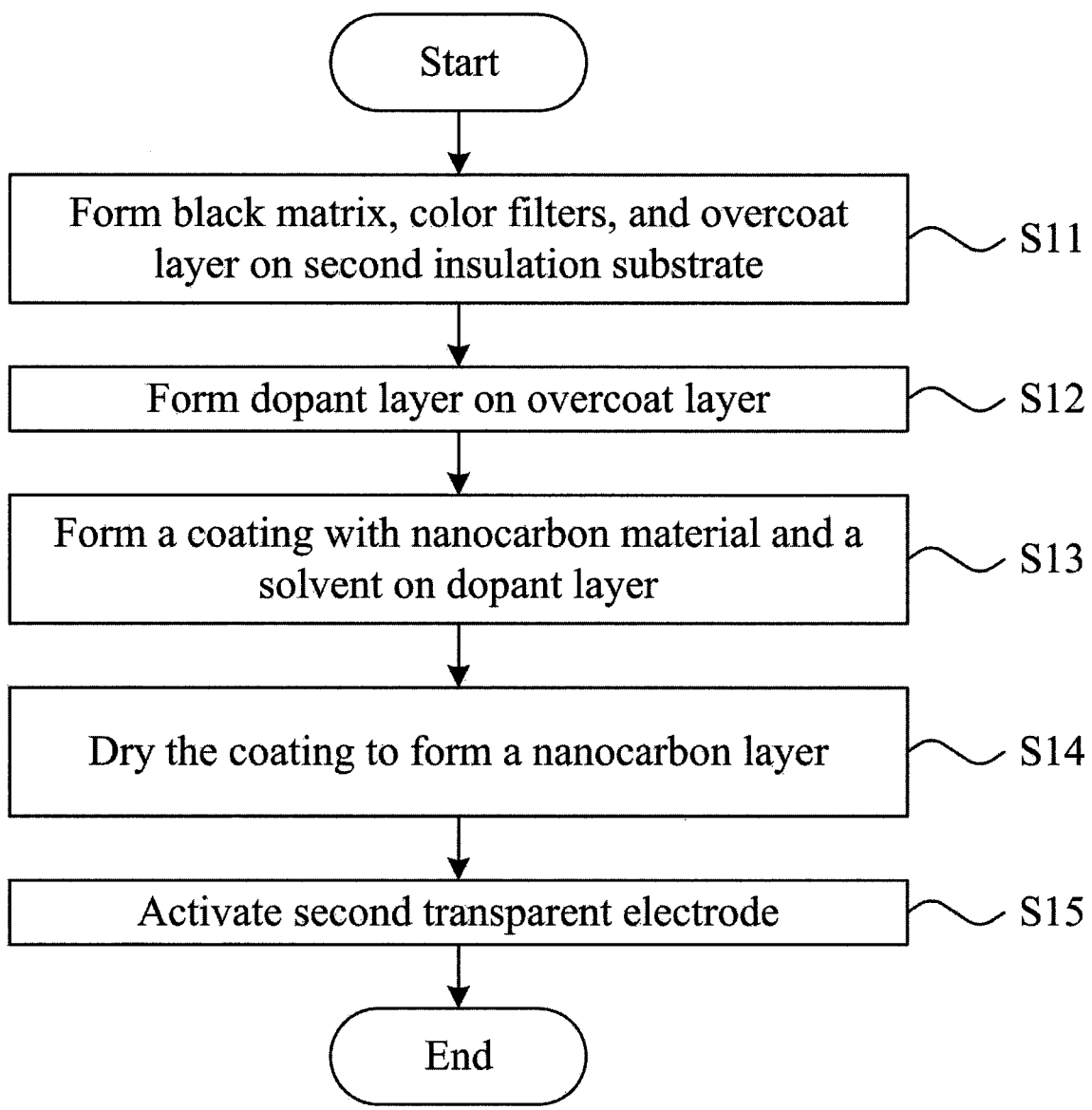
FIG. 3 is a flowchart illustrating a method for manufacturing a display device according to one embodiment of the present invention.
Figure 4:
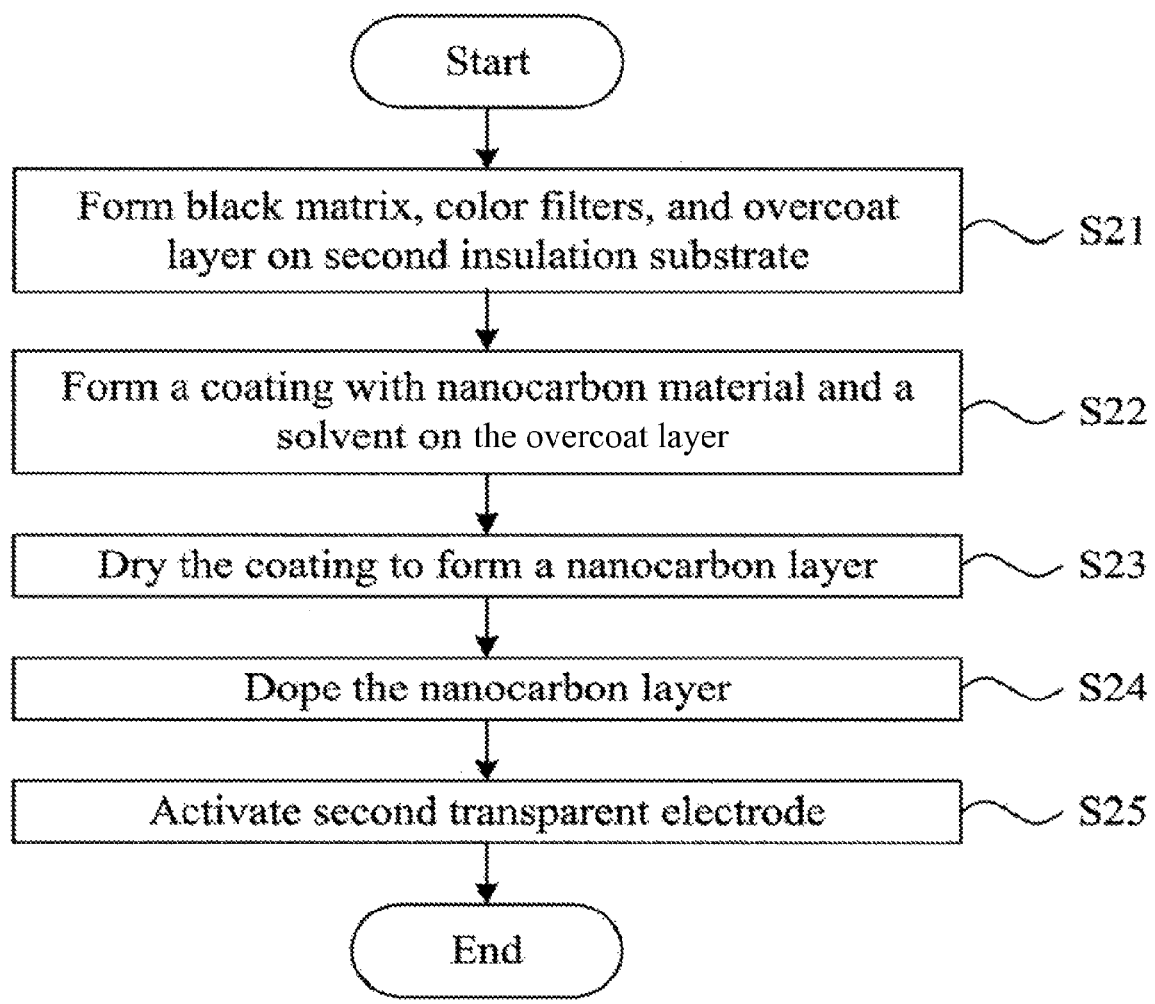
FIG. 4 is a flowchart illustrating a method for manufacturing a display device according to one embodiment of the present invention.
Figure 5:
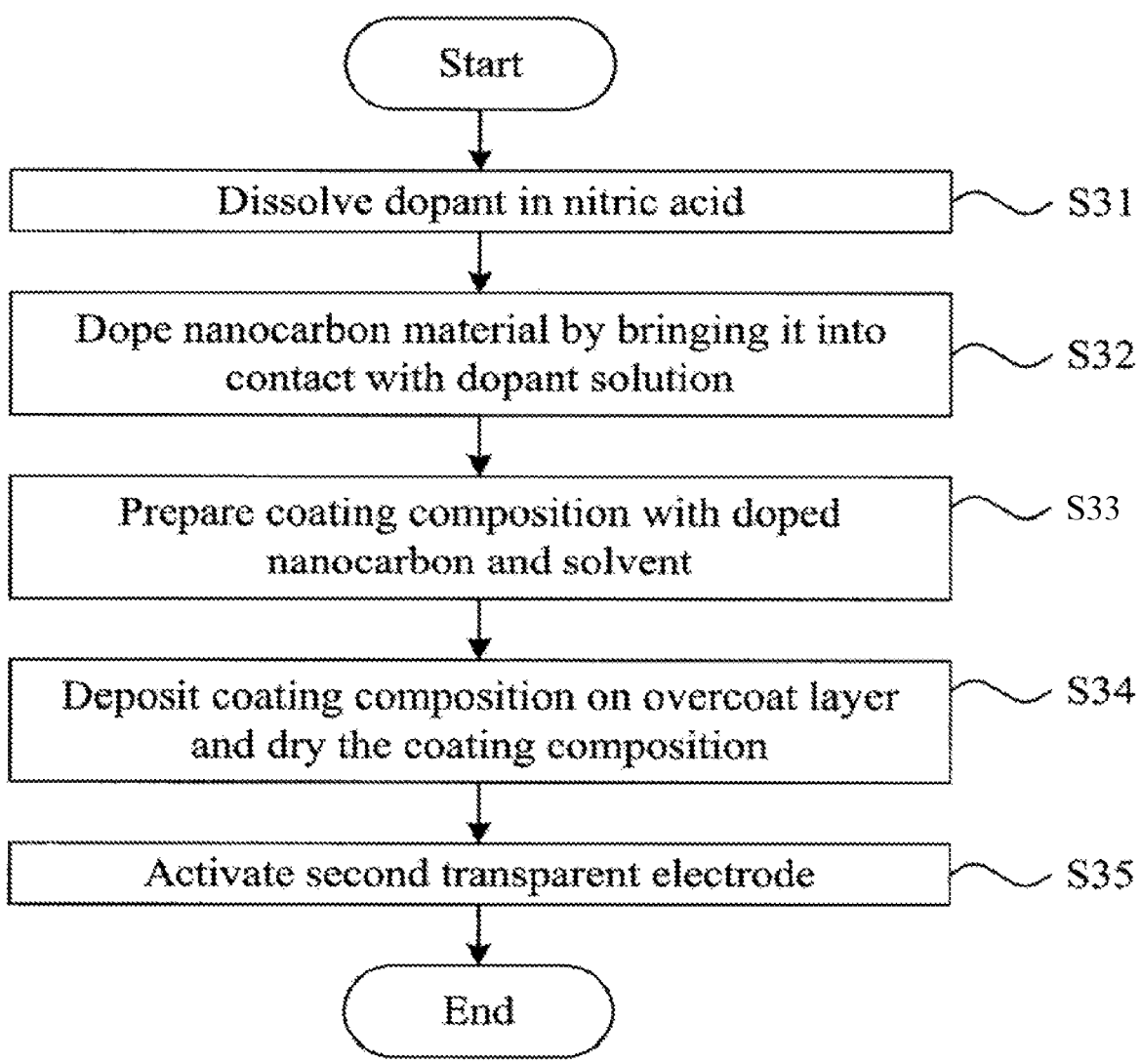
FIG. 5 is a flowchart illustrating a method for manufacturing a display device according to one embodiment of the present invention.

FIGS. 3, 4, 5 illustrate exemplary methods for manufacturing the second substrate 200 of the display device 1. The first substrate 100 can be manufactured and bonded to the second substrate 200 using known methods. The liquid crystal layer 300 can also be manufactured by known methods.

At step S11 (FIG. 3), the black matrix 220, color filters 230, and the overcoat layer 240 are formed on the second insulation substrate 210 by some known methods.

At step S12, the dopant layer 251 is formed over the overcoat layer 240, by sputtering or evaporation for example.

A coating containing nanocarbon material and a solvent is formed on the dopant layer 251 at step S13. Any one of the following can be used as a solvent: DI water (deionized water), alcohol, 1,2-dichlorobenzene, triton X-100, and sodium dodecyl sulfate.

The coating can be formed by spincoating, slitcoating, or ink jetting.

At step S14, the coating is dried to form the nanocarbon layer 252. As a result, the second transparent electrode 250 is formed but not yet activated.

Step S15 completes fabrication of the second substrate 200 by activating the second transparent electrode 250 to enhance the doping effect of the dopant. The activation can be accomplished by heating the nanocarbon layer 252 with microwaves. The microwave heating makes it possible to selectively heat only the nanocarbon material and thus avoid thermal damage to the second insulation substrate 210. This is desirable for example if the second insulation substrate 210 is a plastic substrate that can be easily deformed by heat.

The first transparent electrodes 140 can be formed by the same method as the second transparent electrode 250. The first transparent electrodes 140 can be patterned by patterning the dopant layer and the nanocarbon layer. Both layers can be patterned photolithographically. If the nanocarbon layer is formed using the Inkjet method, the patterning of the nanocarbon layer may be omitted.

FIG. 4 illustrates another exemplary method for manufacturing the second substrate 200 of the display device 1.

First, a black matrix 220, color filters 230, and an overcoat layer 240 are formed on the second insulation substrate 210 by known methods (step S21).

Then a coating containing a nanocarbon material and a solvent is formed on the overcoat layer 240 (step S22). Any of the following can be used as the solvent: DI water, alcohol, 1,2-dichlorobenzene, triton X-100, or sodium dodecyl sulfate.

The coating can be formed by spincoating, slitcoating, or ink jetting.

Then the coating is dried to form a nanocarbon layer (step S23), and the nanocarbon layer is doped with a dopant (step S24). The second transparent electrode 250 is thereby completely formed. The doping can be performed by sputtering or evaporation.

Finally, fabrication of the second substrate 200 is completed by activating the second transparent electrode 250 (step S25). The activation improves the doping effect of the dopant. The activation is performed by heating the nanocarbon layer with microwaves. The microwave heating makes it possible to selectively heat only the nanocarbon material and thus avoid thermal damage to the second insulation substrate 210. This is desirable for example if the second insulation substrate 210 is a plastic substrate that can be easily deformed by heat.

FIG. 5 illustrates another exemplary method for manufacturing the second substrate 200 of the display device 1.

First, a dopant solution is prepared by dissolving a dopant in nitric acid (step S31). Concentration of the nitric acid is about 50% to 80%, and may be about 70%. The nitric acid can be replaced by another acid such as sulphuric or hydrochloric acid.

Then the nanocarbon material is doped by being brought into contact with the dopant solution (step S32). Ultrasonic waves can be used at this step. The dopant forms stable bonds with the nanocarbon material at the atomic level. Any amorphous carbon can be removed with acid.

The mass ratio of the nanocarbon material to the dopant may be about 1:1 to 1:1000.

Steps S31, S32 may be modified in various ways. For example, the dopant and the nanocarbon material may be placed into the nitric acid at the same time, or the nanocarbon material may be placed into the nitric acid before the dopant.

Then the doped nanocarbon material is subjected to filtering and drying to remove the solvent. The drying process may be performed at a temperature of 200° C. to 300° C.

Then a coating composition is prepared (step S33) from the doped nanocarbon material and a solvent. The solvent can be DI water, alcohol, 11,2-dichlorobenzene, triton X-100, or sodium dodecyl sulfate. Ultrasonic waves can be used to disperse the doped nanocarbon material in the solvent.

At step S34, the coating composition is deposited to cover the entire overcoat layer 240 and is dried to provide the second transparent electrode 250. The coating composition can be deposited by spincoating, slitcoating, ink jetting, or spraying.

Finally, the second transparent electrode 250 (step S35) is activated to finish the fabrication of the second substrate 200. The activation improves the doping effect of the dopant. The activation is performed by heating the nanocarbon layer with microwaves. The microwave heating makes it possible to selectively heat only the nanocarbon material and thus avoid thermal damage to the second insulation substrate 210. This is desirable for example if the second insulation substrate 210 is a plastic substrate that can be easily deformed by heat.

Table 1 below shows experimental data obtained for the sheet resistance and transmittance of nanocarbon transparent electrodes manufactured as described above. The "Comparative Example" column refers to a transparent electrode made of undoped nanocarbon. In the "Experimental Example 1" and "Experimental Example 2", the transparent electrode was manufactured by the method of FIG. 4. The "Experimental Example 1" column shows the transmittance and sheet resistance before the activation, and the "Experimental Example 2" shows the transmittance and sheet resistance after the activation. The "Experimental Example 3" shows the transmittance and sheet resistance for a transparent electrode manufactured by the method of FIG. 5 but before activation. In the Experimental Examples 1, 2 and 3, the dopant is aluminum.

TABLE 1

|  | Comparative Example | Experimental Example 1 | Experimental Example 2 | Experimental Example 3 |
| --- | --- | --- | --- | --- |
| Sheet resistance (ohm/sq) | 5800 | 980 | 2400 | 900 |
| Transmittance (%) | 96 | 57 | 78 | 80 |

As seen in Table 1, the Comparative Example has excellent transmittance, but the high sheet resistance is a serious disadvantage. In comparison, the Experimental Examples have lower sheet resistance. Their transmittance is fairly high even though it is lower than that of the Comparative Example. The Experimental Examples are thus quite suitable for use as transparent electrodes.

Of note, the transmittance of Experimental Example 2 is higher than that of Experimental Example 1 because in the Experimental Example 2 the nanocarbon material is bonded with aluminum at the atomic level.

Figure 6:
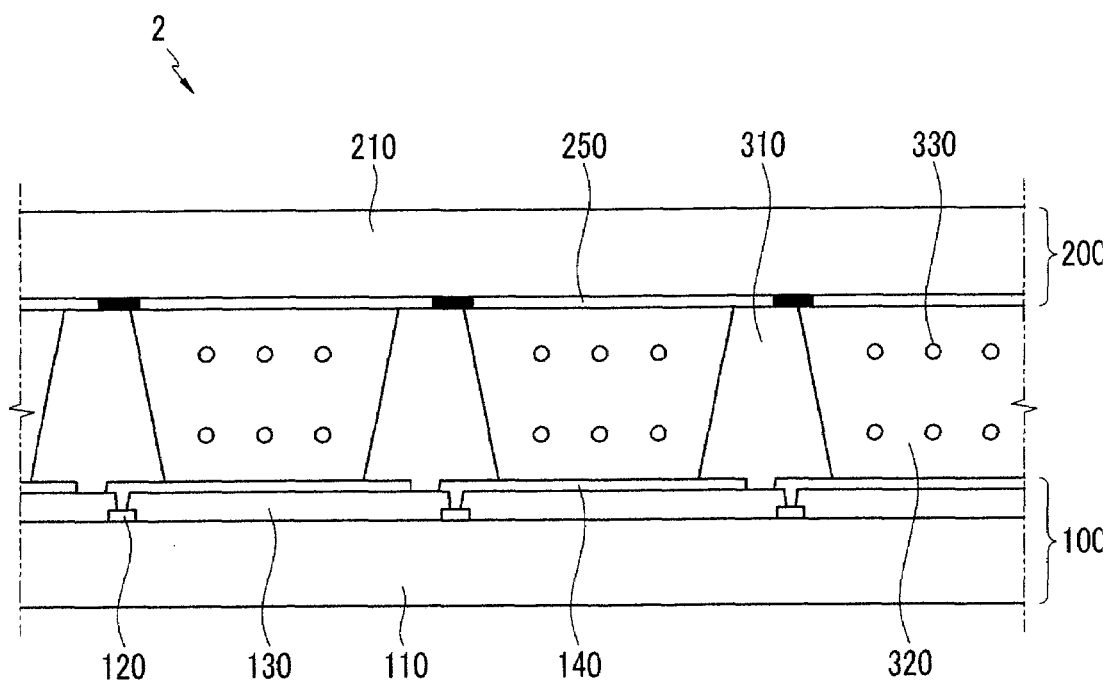
FIG. 6 is a cross-sectional view of a display device according to one embodiment of the present invention.

FIG. 6 shows a display device 2 according to another exemplary embodiment of the present invention. The display device 2 is an electrophoretic display.

The display device 2 includes a first substrate 100, a second substrate 200, a barrier rib 310 disposed between the first and second substrates 100 and 200, a fluid layer 320, and charged particles 330.

The first substrate 100 includes a first insulation substrate 110, thin film transistors 120, an insulation layer 130, and first transparent electrodes 140. Each first transparent electrode 140 is electrically connected to a respective thin film transistor 120. The first transparent electrodes 140 are spaced from each other and electrically insulated from each other.

The second substrate 200 includes a second insulation substrate 210 and a second transparent electrode 250. The second transparent electrode 250 extends through the entire second substrate 200.

The transparent electrodes 140 and 250 can be manufactured by any of the methods described above in connection with FIGS. 3, 4, 5. The same method or different methods can be used for first transparent electrodes 140 and the second transparent electrode 250 in a single display device.

The barrier rib 310 separates the adjacent pixels from each other by separating and containing the respective portions of the fluid layer 320. Preferably, the fluid layer 320 has low viscosity to provide high mobility to the charged particles 330, and has a low dielectric constant to suppress chemical reaction. It is also preferable that the fluid layer 320 be transparent in order for the display device to have reflected luminance.

The charged particles 330 may be white or black. In each pixel, the charged particles 330 migrate from one of the transparent electrodes 140 and 250 to the other, and more particularly to the electrode having opposite polarity from the charged particles 330, to form a desired image. In some embodiments, the charged particles 330 are multicolor particles to enable formation of color images.

Figure 7:
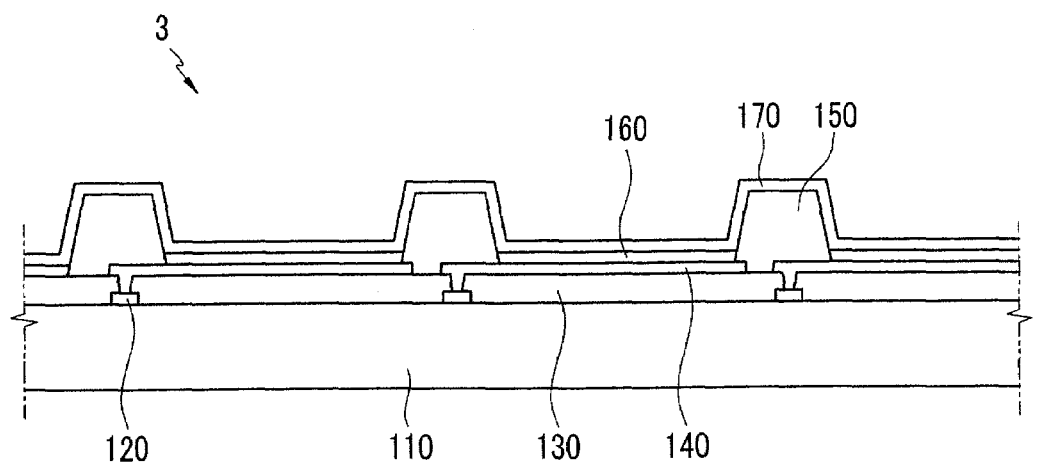
FIG. 7 is a cross-sectional view of a display device according to one embodiment of the present invention.

FIG. 7 illustrates a display device 3 according to another embodiment of the present invention. The display device 3 is an organic light emitting device.

In the display device 3, a barrier rib 150 is formed over first transparent electrodes 140 and an insulation layer 130. An organic layer 160 is formed over the first transparent electrodes 140 in areas not covered by the barrier rib 150. The organic layer 160 may include a hole transport layer, an emission layer, and an electron transport layer. The organic layer 160 is the light emitting part of the display device. A second transparent electrode 170 is formed over the organic layer 160 and the barrier rib 150.

Electrons and holes emitted from the transparent electrodes 140 and 170 are excited in the organic layer 160, and the excited electrons and holes emit light when recombination occurs.

The transparent electrodes 140 and 170 may be manufactured by any of the methods described above in connection with FIGS. 3, 4, 5. The first transparent electrodes 140 and the second transparent electrode 170 can be manufactured by the same method or by different methods in a single display device.

Some embodiments of the present invention provide a transparent electrode for a display device. The transparent electrode is made using nanocarbon material and has excellent transmittance and sheet resistance.

Some embodiments of the present invention also provide a display device including a transparent electrode made using nanocarbon material and having excellent transmittance and sheet resistance.

The present disclosure of invention is not limited to the embodiments described above but rather its teachings are to be understood as including other embodiments and variations within the spirit of the present teachings including those defined by the appended claims.

What is claimed is:

1. A display device comprising:
an insulation substrate; and
a transparent electrode formed on the insulation substrate, wherein the transparent electrode comprises:
an activated nanocarbon layer which is doped with a dopant; and
a dopant layer including a dopant and physically contacting the activated nanocarbon layer,
wherein the dopant layer has a thickness of about 3 nm to about 7 nm; and
wherein the dopant of the activated nanocarbon layer and the dopant of the dopant layer are the same and consist of at least one of aluminum, alumina, palladium, and gold.

2. The display device of claim 1, wherein the activated nanocarbon layer comprises at least one of activated carbon nanotubes and activated carbon nanowire.

3. The display device of claim 1, wherein activation of the activated nanocarbon layer is achieved by selectively heating a nanocarbon layer physically contacting said dopant layer.

4. The display device of claim 3, wherein activation of the activated nanocarbon layer is achieved by selectively microwave heating a nanocarbon layer physically contacting said dopant layer.

5. The display device of claim 1, wherein the dopant consists of alumina.

6. The display device of claim 1, wherein the dopant consists of palladium.

7. The display device of claim 1, wherein the insulation substrate is a plastic substrate.

8. The display device of claim 7, wherein the dopant consists of alumina.

9. The display device of claim 7, wherein the dopant consists of palladium.

10. A transparent electrode comprising:
an activated nanocarbon layer which is doped with a dopant; and
a dopant layer including a dopant and physically contacting said activated nanocarbon layer,
wherein the dopant layer has a thickness of about 3 nm to about 7 nm; and
wherein the dopant of the activated nanocarbon layer and the dopant of the dopant layer are the same and consist of at least one of aluminum, alumina, palladium, and gold.

11. The transparent electrode of claim 10, wherein the activated nanocarbon layer comprises at least one of activated carbon nanotubes and activated carbon nanowire.

12. The transparent electrode of claim 10 wherein activation of the activated nanocarbon layer is achieved by selectively heating a nanocarbon layer physically contacting said dopant layer.

13. The transparent electrode of claim 12 wherein the activation of the activated nanocarbon layer is achieved by selectively microwave heating a nanocarbon layer physically contacting said dopant layer.

14. The transparent electrode of claim 10 wherein the dopant consists of alumina.

15. The transparent electrode of claim 10 wherein the dopant consists of palladium.

* * * * *